(12) United States Patent
Hua et al.

(10) Patent No.: US 6,398,584 B1
(45) Date of Patent: Jun. 4, 2002

(54) BALUN AND ASSOCIATED METHOD FOR CONNECTING CABLES

(75) Inventors: Henry Hua, Kenthurst; Gong Zhang, Merrylands; Fredrick Felton, Kogaran Bay, all of (AU)

(73) Assignee: A. C. & E. PTY Limited, West Ryde (AU)

( * ) Notice: Subject to any disclaimer, the term of this patent is extended or adjusted under 35 U.S.C. 154(b) by 0 days.

(21) Appl. No.: 09/744,348

(22) PCT Filed: Jul. 23, 1999

(86) PCT No.: PCT/AU99/00596

§ 371 (c)(1),
(2), (4) Date: Mar. 26, 2001

(87) PCT Pub. No.: WO00/05811

PCT Pub. Date: Feb. 3, 2000

(30) Foreign Application Priority Data

Jul. 23, 1998 (AU) .............................................. PP 4824

(51) Int. Cl.[7] ................................................. H01R 9/05
(52) U.S. Cl. ....................................... 439/578; 439/620
(58) Field of Search ................................ 439/578, 668, 439/620, 98; 333/25

(56) References Cited

U.S. PATENT DOCUMENTS

| 5,240,436 A | * | 8/1993 | Bradley et al. | ............. 439/620 |
| 5,495,212 A | * | 2/1996 | DeCramer | .................... 333/25 |
| 5,548,254 A | * | 8/1996 | Ueno et al. | .................... 333/25 |
| 5,633,614 A | * | 5/1997 | Decramer | ..................... 333/25 |
| 5,639,262 A | * | 6/1997 | Lim | ........................... 439/607 |
| 6,100,772 A | * | 8/2000 | Decramer et al. | ............ 333/25 |

* cited by examiner

*Primary Examiner*—Brian Sircus
*Assistant Examiner*—Hae Moon Hyeon
(74) *Attorney, Agent, or Firm*—Howrey Simon Arnold & White, LLP (57) ABSTRACT

A balun and method for electrically connect a twisted pair cable (2) to a coaxial cable (3) are disclosed. The twisted pair cable (2) has two active wires (4, 5), an earthing wire (6) and shielding (7). The balun includes a hollow conductive cover (8) defining first and second apertures (9, 10); the first aperture (9) being sized to accept the twisted pair cable (2). The cover (8), when in use, houses an earthing means (11) for electrically connecting the earthing wire (6) and/or shielding (7) to the cover (8). The cover, when in use, further houses first mounting means (12) adapted to mount the active wires (4, 5) in close proximity to the second aperture (10); and a body (13) housing second mounting means (14) adapted to mount a pair of first connectors (15, 16) projecting from the body. The body further houses a first transformer (17) electrically connected to the first connectors (15, 16). An end of the body (13) defines a coaxial connector (18) electrically connected to the first transformer (17), whereby the cover (8) is mountable to the body such that an earthing connection is made therebetween, and such that the first connectors (15, 16) respectively electrically connect with the active wires (4, 5), thereby completing an impedance matching electrical circuit between the twisted pair cable (2) and the coaxial cable connector (18).

27 Claims, 12 Drawing Sheets

BALUN AND ASSOCIATED METHOD FOR CONNECTING CABLES

TECHNICAL FIELD

The present invention relates to baluns and in particular to baluns adapted to electrically connect a twisted pair cable to a coaxial cable. The invention further relates to a method for connecting a twisted pair cable to a coaxial cable.

BACKGROUND ART

Baluns, or impedance matching devices as they are also known, are used to connect cables having differing impedances. For example, a common requirement in the telecommunications industry is the connection of twisted pair cabling, typically having an impedance of 120 ohms, with coaxial cables which usually have an impedance of 75 ohms and similar impedance matching to systems.

Known baluns can potentially degrade the overall performance of cabling by allowing either internal electromagnetic radiation to escape from the cable or external electromagnetic radiation to interfere with the signals conveyed thereon. In addition, some known baluns require the use of specialised tools to complete the connection process. Further, known baluns are bulky thereby wasting valuable space, particularly, for example, in large telecommunications stations where thousands of baluns may be connected in parallel and in close proximity. Known baluns also do not provide a rigid connection, thereby potentially exposing components and connections to bending stresses and the like.

It is an object of the present invention to overcome or ameliorate at least one of the disadvantages of the prior art, or to provide a useful alternative.

DISCLOSURE OF THE INVENTION

According to a first aspect of the invention there is provided a balun adapted to electrically connect a twisted pair cable to a coaxial cable, said twisted pair cable having two active wires, an earthing wire and shielding, said balun including:
  a hollow conductive cover defining first and second apertures; said first aperture being sized to accept said twisted pair cable; said cover, when in use, housing an earthing means for electrically connecting said earthing wire and/or shielding to said cover; said cover, when in use, further housing first mounting means adapted to mount said active wires in close proximity to said second aperture; and
  a body housing second mounting means adapted to mount a pair of first connectors projecting from said body; said body further housing a first transformer electrically connected to said first connectors; an end of said body defining a coaxial connector being electrically connected to said first transformer,
  whereby said cover is mountable to said body such that an earthing connection is made therebetween, and such that said first connectors respectively electrically connect with said active wires, thereby completing an impedance matching electrical circuit between said twisted pair cable and said coaxial cable connector.

Preferably the earthing means is a metallic ring around which said shielding is wrappable and to which said earthing wire is connectable. The cover preferably includes a first cylindrical portion of minor diameter defining said first aperture and a second cylindrical portion of major diameter defining said second aperture, said first and second portions being joined by a radial portion, said ring being adapted to abut said radial portion within said second cylindrical portion.

According to a second aspect of the invention there is provided a method for connecting a twisted pair cable having two active wires, an earthing wire, shielding and outer insulation to a coaxial cable, said method including the steps of:
  i) threading said twisted pair cable through a hollow conductive cover;
  ii) removing a length of outer insulation from the twisted pair cable;
  iii) connecting said shielding and/or said earthing wire to an earthing means;
  iv) mounting, said active wires in a first mounting means;
  v) housing said first mounting means in said cover such that said earthing means and associated shielding and/or earthing wire make earthing contact with said cover and such that said active wires are disposed adjacent an aperture of said cover;
  vi) mating a body with said cover such that first connectors projecting from said body make electrical connection with said active wires, said body including a first transformer electrically connected to said first connectors, said body further including a coaxial connector electrically connected to said first transformer; and
  vii) connecting said coaxial cable to said coaxial connector.

It will be appreciated that while the invention has been described above with reference to connection of cables, it can also be used to connect either a twisted pair or a coaxial cable directly onto a system. For example the connection of a twisted pair cable onto a coaxial connector disposed on a piece of telecommunications hardware.

BRIEF DESCRIPTION OF THE DRAWINGS

A preferred embodiment of the invention will now be described, by way of example only, with reference to the accompanying drawings in which.

PREFERRED EMBODIMENTS OF THE INVENTION

Referring to the drawings, the balun 1 is adapted to electrically connect a twisted pair cable 2 to a coaxial cable 3. The twisted pair cable has two active wires 4 and 5, an earthing wire 6 and shielding 7. The balun 1 includes a hollow conductive cover 8 defining first and second apertures 9 and 10 respectively. The first aperture 9 is sized to accept the twisted pair cable 2. When in use, the cover houses an earthing means 11 for electrically connecting the earthing wire 6 and shielding 7 to the cover 8.

When in use, the cover 8 also houses first mounting means 12 which is adapted to mount the active wires 4 and 5 in close proximity to the second aperture 10. The balun 1 also includes a body 13 which houses second mounting means 14 adapted to mount a pair of first connectors 15 and 16 in the form of prongs projecting from the body 13. The body further houses a first transformer 17 electrically connected to the prongs 15 and 16. The first transformer allows the impedance of the twisted pair cable 2 to be matched to the impedance of the coaxial cable 3.

The coaxial cable (not illustrated) connects to the coaxial connector 18 such that a coaxial signal is communicable to the pin 81, and then, via the signal wire 78, to the first transformer 17. After passing through one of the windings 50 of the first transformer 17, the coaxial signal completes its circuit to earth via transformer wire 79 and pin 80, back to the return path of the coaxial cable, namely the outer shield.

The first transformer 17 is a surface mount component. Advantageously this allows the first transformer to be smaller than those used in the prior art. This allows the overall width of the balun 1 to be of a similar order as the width of the coaxial cable 3. It also allows the balun 1 to have a shorter length than that of the prior art.

Two types of first transformer 17 are utilised in the preferred embodiments of the invention. A low-speed first transformer is suited for data transmission rates in the range of 2 Mbit/s to 34 Mbit/s. The low speed first transformer features a coil connected to the twisted pair cable side of the balun having twelve (12) turns and a coil connected to the coaxial cable side of the balun having ten (10) turns. It will be appreciated, however, that numerous different specifications of first transformers may be utilised to suit various applications. The low-speed first transformer typically has the following properties:

| | |
|---|---|
| Minimum Primary Inductance (12Ts) | 190 μH |
| Maximum Leakage Inductance | 0.25 μH |
| Maximum Interwinding Cap | 15 PF |
| Hi-Po Test | 500 VDC/0.5 mA |

The preferred embodiment of the balun according to the present invention, when utilising the low-speed first transformer, gives the following electrical characteristics and performance:

CHARACTERISTIC IMPEDANCE: The value of the impedance match is 75±8 ohms resistive to 120±10 ohms resistive, when measured from 1 to 17 MHz with the unused end terminated into the respective resistive load.

INSERTION LOSS: The insertion loss from both sides of the balun is less than 0.5 dB from 1 MHz to 17 MHz, and less than 0.8 dB from 17 MHz to 70 MHz.

CROSSTALK PERFORMANCE: Crosstalk between any two baluns mounted on a DDF strip is better than 80 dB for any balun orientation from 1 MHz to 70 MHz (all baluns to be terminated correctly).

RETURN LOSS: The return loss is better than 15 dB over the frequency range of 1 Mhz to 70 Mhz and better than 22 dB over the frequency range of 1 Mhz of 17 Mhz in both directions of transmission and with the unused port terminated in the respective impedance.

A high-speed first transformer is designed for data transmission rates in the range of 34 Mbit/s to 155 Mbit/s. The high-speed first transformer features a first coil having six (6) turns on the twisted pair side of the balun and five (5) turns on the coaxial side of the balun. The properties of the high-speed first transformer are typically as follows:

| | |
|---|---|
| Minimum Primary Inductance (6Ts) | 60 µH |
| Maximum Leakage Inductance | 0.12 µH |
| Maximum Interwinding Cap | 6.0 PF |
| Hi-Po Test | 500 VDC/0.5 mA |

The preferred embodiment of the balun according to the present invention, when utilising the high-speed first transformer, gives the following electrical characteristics and performance:

CHARACTERISTIC IMPEDANCE: The value of the impedance match is 75±8 ohms resistive to 120±10 ohms resistive, when measured from 17 to 70 MHz with the unused end terminated into the respective resistive load.

INSERTION LOSS: The insertion loss from both sides of the balun is less than 1 dB from 17 MHz to 70 MHz, and less than 1.3 dB from 1 MHz to 155 MHz.

CROSSTALK PERFORMANCE: Crosstalk between any two baluns mounted on a DDF strip is better than 80 dB for any balun orientation from 1 MHz to 155 MHz (all baluns to be terminated correctly).

RETURN LOSS: The return loss is better than 18 dB over the frequency range of 1 MHz to 155 MHz and better than 22 dB over the frequency range of 17 MHz to 70 MHz in both directions of transmission and with the unused port terminated in the respective impedance.

Figure 24:
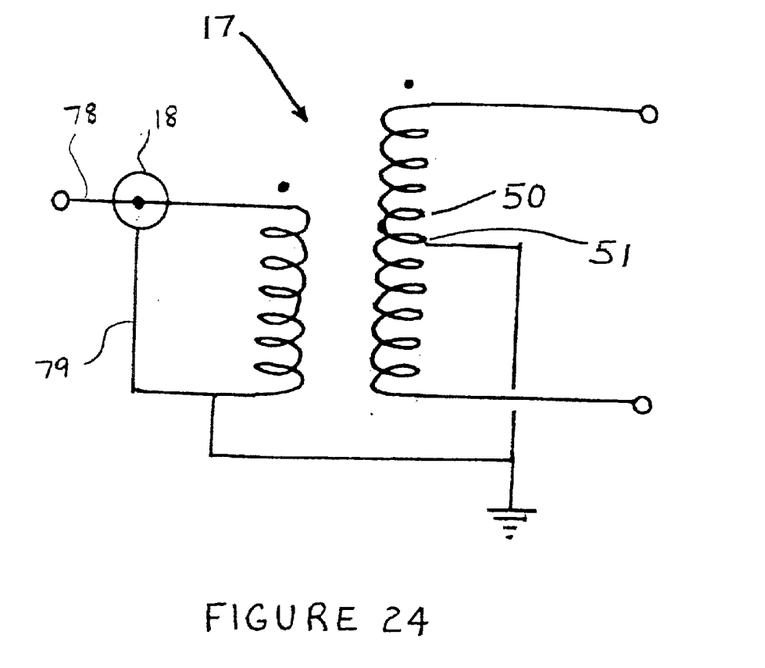
FIGS. 24 and 25 are schematic diagrams of transformer arrangements used to provide longitudinal balance in the first transformer of the invention.
Figure 25:
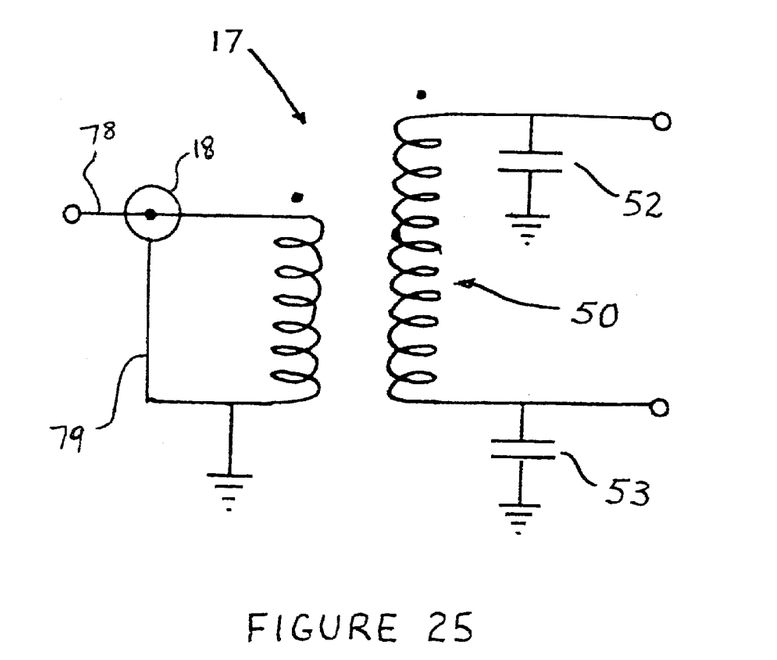

Due to regulatory and customer requirements in relation to radiation leakage and external interference, as mentioned earlier, it is desirable to shield the connection as much as possible. It has been found that another solution to this problem is to obtain a high degree of balance across the connection. Referring to FIGS. 24 and 25, this can be done in a number of ways including providing the secondary winding 50 of the first transformer 17 with a centre tap 51 which is earthed to provide equal induction in the first transformer windings about earth/ground potential. This can be done by using a trifilar winding in the first transformer windings. Another method, as shown in FIG. 25, is to use an external capacitance (52, 53) connected between each leg of the secondary winding (50) and earth so as to balance the uneven capacitance inherent in the winding to ground. In order to achieve a nominated Longitudinal Balance of better than 35 dB at 155 MHz it has been found desirable to use one or a combination of both methods.

Figure 26:
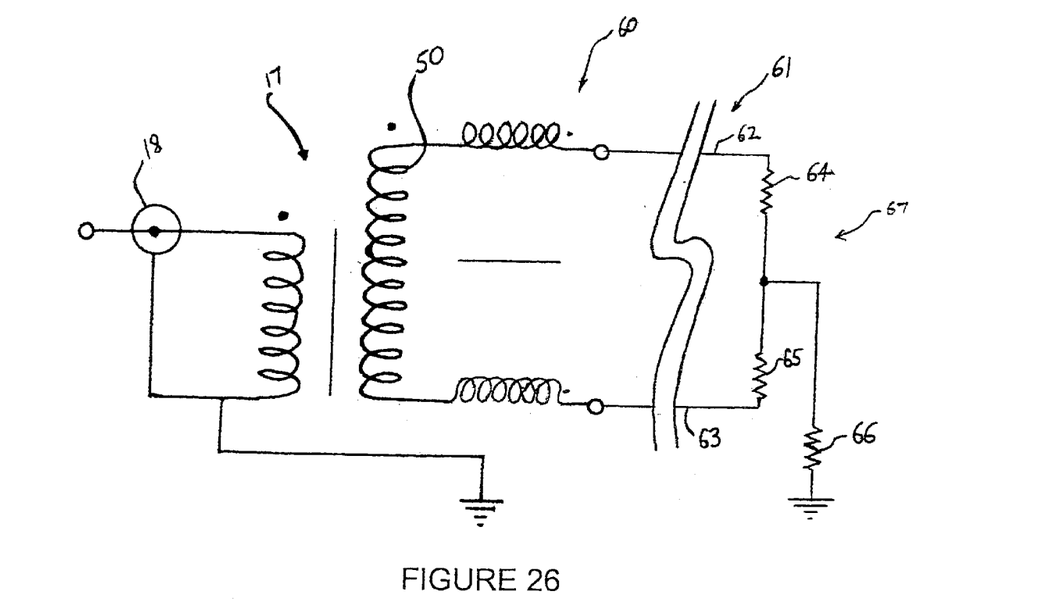
FIGS. 26 and 27 are schematic diagrams of alternative transformer arrangements used to provide longitudinal balance in the first transformer of the invention, along with test circuitry used to provide a measure of common mode rejection.
Figure 27:
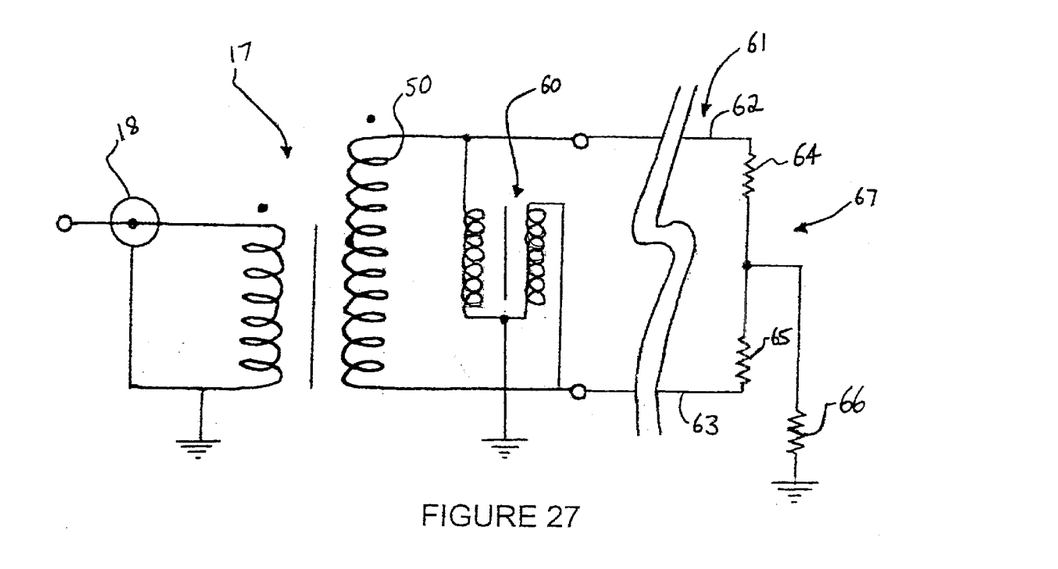
Figure 28:
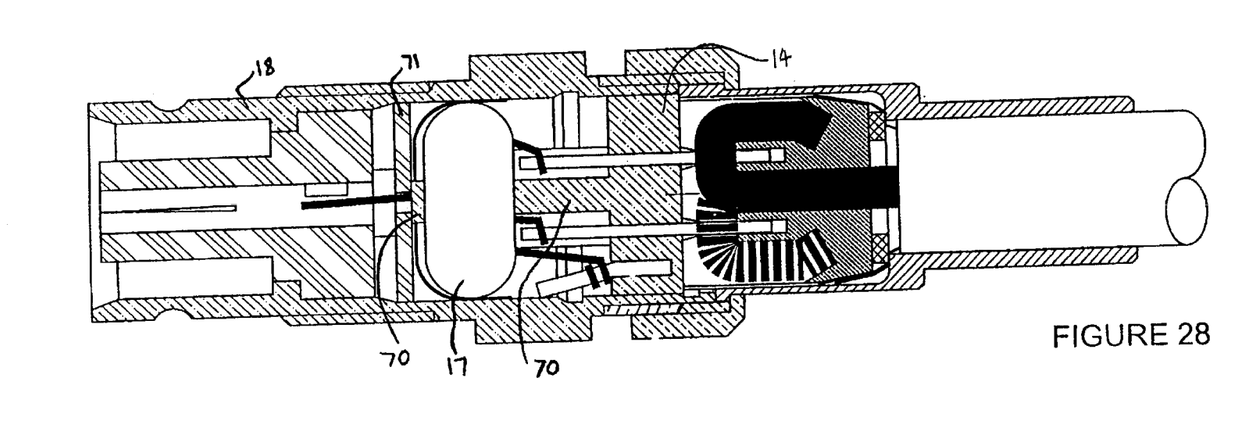
FIG. 28 is a cross-sectional side view of an alternative embodiment of the balun with provision for reducing or eliminating compressive forces transferred from the coaxial cable connector.

FIGS. 26 and 27 show alternative arrangements which provide for a high degree of balance across the connection to help avoid rogue currents arising due to imbalance of cross-coupling capacitance in first transformer 17, or other unbalancing effects. These embodiments include a second transformer 60 connected to promote inductive balance between the coaxial cable and the twisted pair cable. In the circuit shown in FIG. 26, the second transformer 60 is connected in series intermediate the secondary winding 50 of the first transformer 17 and the length of the twisted pair cable 61. The inductive impedance of the second transformer 60 is preferably very high to effectively "block" common-mode imbalance signals in both signal 62 and return 63 paths. It is preferable to achieve high inductive impedance of the second transformer 60 with minimum turns to eliminate interwinding capacitance which will tend to degrade transmission performance at higher frequencies. The preferable impedance of the second transformer 60 should be selected depending upon the particular application for which it is utilised.

Three resistors 64, 65 and 66 are provided at the distal end 67 of the twisted pair cable 61 to allow for testing of the balance within the cable. In the preferred embodiment, resistors 64 and 65 are each 60 ohms, and resistor 66 is 120 ohms. If there is an imbalance causing a current to circulate in the cable, this will result in a current across resistor 66 which can be detected either by placing an ammeter (not illustrated) in series with the resistor 66, or by measuring the voltage drop across the resistor 66 that the second transformer 60 is connected parallel to the first transformer 17 and phased such that the two wires 62 and 63 of the twisted pair cable 61 are pulled to ground equally. Once again, the resistors 64, 65 and 66 are provided only for testing of the balance of the arrangement.

Referring back to FIGS. 1 to 4, when the cover 8 is mounted to the body 13 an earthing connection is made therebetween. Hence, because the shielding 7 and/or the earthing wire 6 are connected to the cover 8, which is in turn connected to the body 13 which, is ultimately connected to the coaxial cable 3, the whole length of the balun connection is earthed and shielded from ingress or leakage of electromagnetic radiation. Due to the fully shielded construction, secure termination and earthing provided by the balun, it is designed to the requirements of Telstra Standard 1554 Part 2 Issue 1 to "class A equipment" for radiated emission (or equivalent in CISPR 22).

When the cover 8 is mounted to the body 13, the prongs 15 and 16 electrically connect with the active wires 4 and 5 respectively, thereby completing an impedance matching electrical circuit between the twisted pair cable 2 and the coaxial cable 3. The connection between the prongs 15 and 16 and the active wires 4 and 5 is preferably by means of insulation displacement connectors (DC) whereby the prongs displace the insulation of the active wires to contact the internal conductor. The earthing means 11 is in the form of a annular ring around which the shielding 7 is wrappable and to which the earthing wire 6 is connectable.

Figure 4:
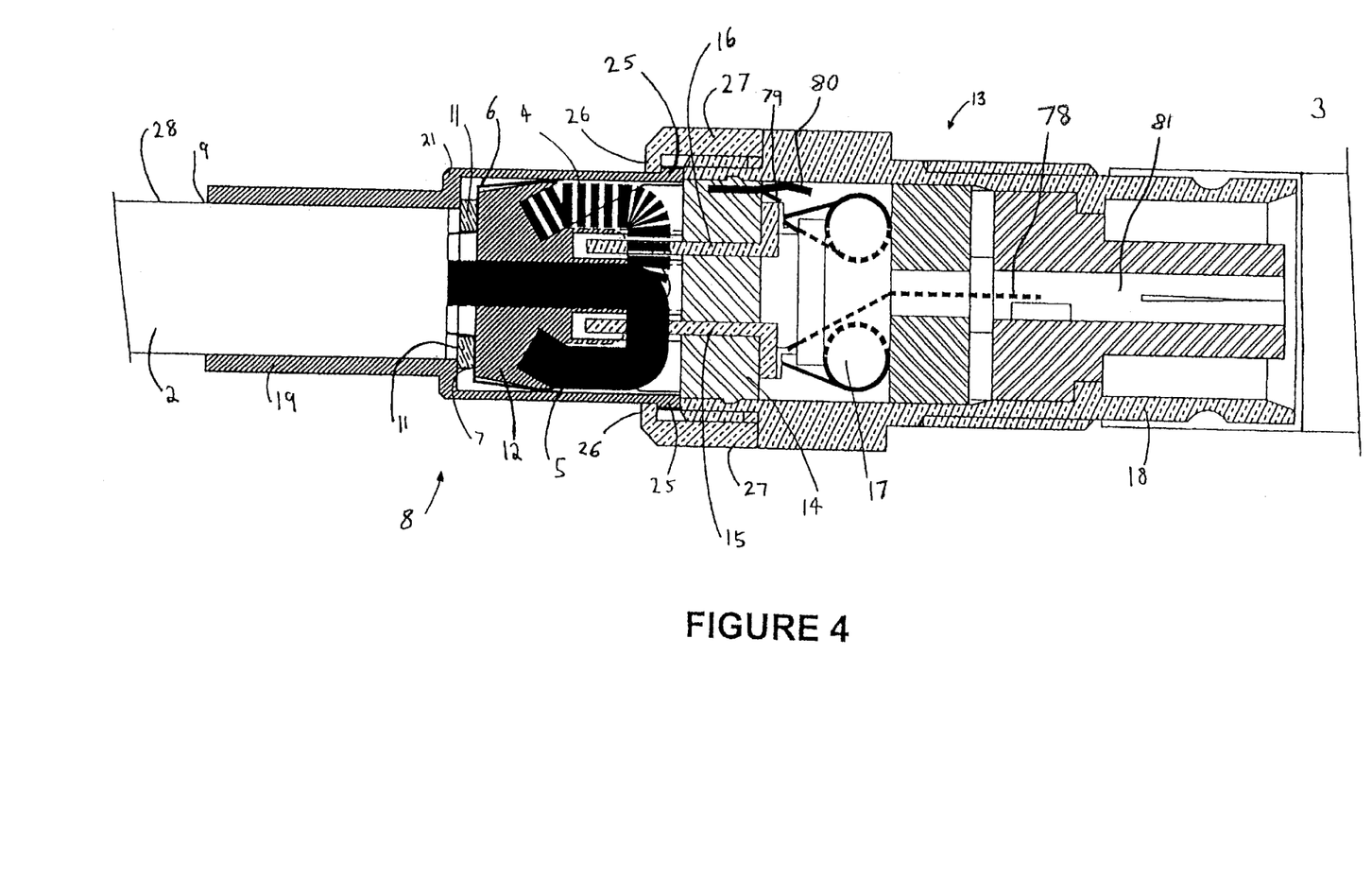
FIG. 4 is a longitudinal cross section of the balun taken along line 4—4 of FIG. 1.

The cover 8 includes a first cylindrical portion 19 of minor diameter, the end of which defines first aperture 9. The cover 8 also includes a second cylindrical portion 20 of major diameter, an end of which defines second aperture 10. The first and second cylindrical portions 19 and 20 are joined by a radial portion 21. The ring 11 has an outer diameter slightly less than the inner diameter of the second cylindrical portion 20 and the ring 11 has an inner diameter roughly equivalent to the inner diameter of the first cylindrical portion 19. The ring 11 is adapted to abut the radial portion 21 within the second cylindrical portion 20, as shown in FIG. 4. In this manner, the seating of the ring 11 in abutment with the radial portion 21 provides earthing of the shielding 7 around the full circumference of the radial portion.

Figure 1:
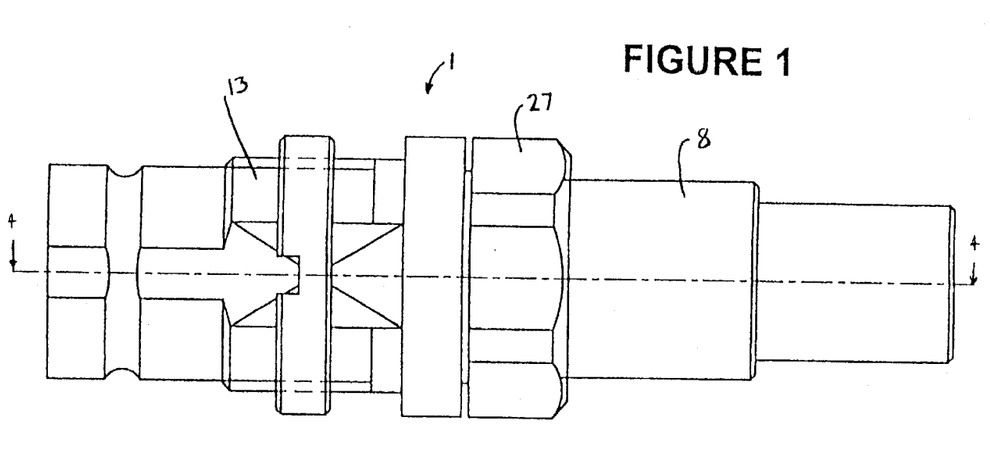
FIG. 1 is a plan view of a balun according to the invention.
Figure 2:
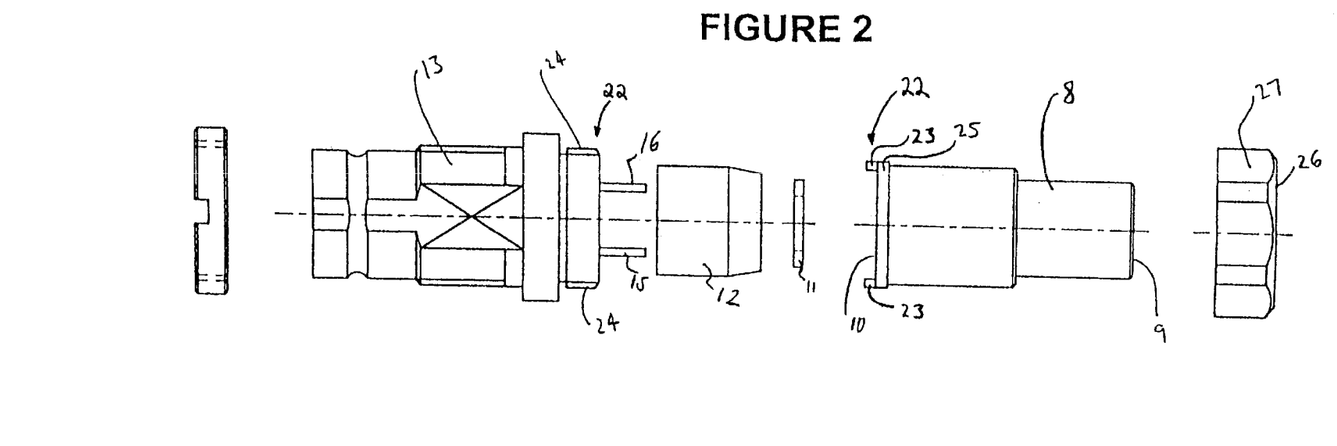
FIG. 2 is a partially disassembled view of the balun of FIG. 1.
Figure 3:
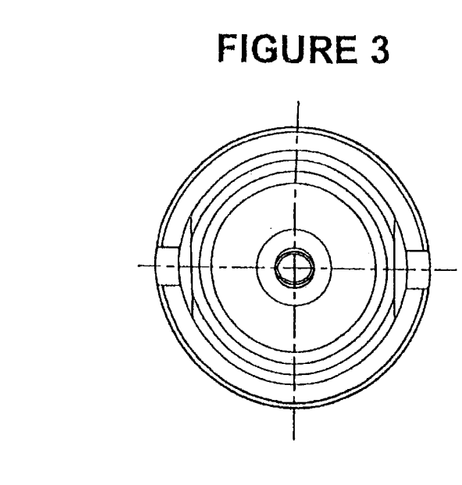
FIG. 3 is an end view of the balun shown in FIG. 1.

As best shown in FIG. 2, the cover 8 and body 13 include keying means 22 which facilitate mounting of the body to the cover. The keying means 22 includes a pair of lugs 23 projecting longitudinally from the second aperture 10 of the cover 8. The lugs 23 are adapted to mate with corresponding indents 24 in the body 13. In alternative embodiments (not illustrated) differing keying means are used, for example lugs 23 are provided upon the body 13 and indents are provided upon the cover 8.

The cover 8 is rigidly fixable to the body 13. In particular, the cover 8 includes a radially outwardly projecting lug 25 disposed adjacent the second aperture 10. The lug 25 is adapted to engage a corresponding radially inwardly projecting lug 26 provided on nut 27. The nut is threadably engagable with the body 13 so as to rigidly fix the cover 8 to the body 13. Both the cover 8 and the body 13 are constructed from a sturdy conductive material such as metal, hence once the nut 27 is tightened, a rigid connection between the twisted pair cable 2 and the coaxial cable 3 is advantageously provided. In this manner, the connections and the components inside the balun of the present invention are not subject to the same bending stresses that may be experienced by the less rigid arrangements of the prior art.

The first mounting means 12 is a stuffer cap, a first embodiment of which includes two longitudinally extending apertures 29 and 30, as shown in FIGS. 5 to 8 inclusive. The active wires 4 and 5 are passed through apertures 29 and 30. Wire 4 protruding from aperture 29 is then bent through approximately 90° so as to lie in groove 31. Similarly, wire 5 protruding from aperture 30 is bent through approximately 90° in the opposite direction so as to lie in groove 32. Any excess lengths of active wires 4 and 5 are then bent through approximately 90° once again so as to lie in grooves 33 and 34.

Figure 5:
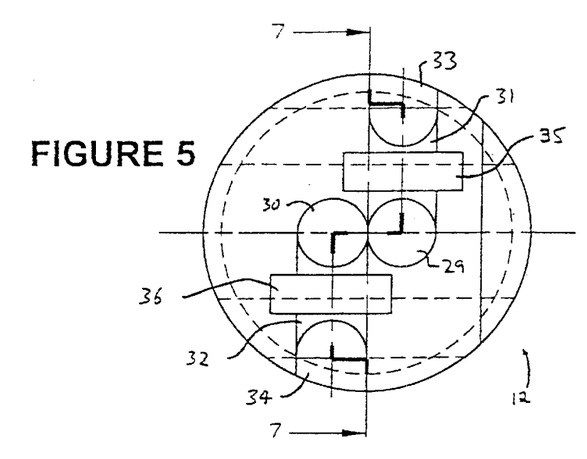
FIG. 5 is a plan view of a stuffer cap as used in one embodiment of the present invention.
Figure 6:
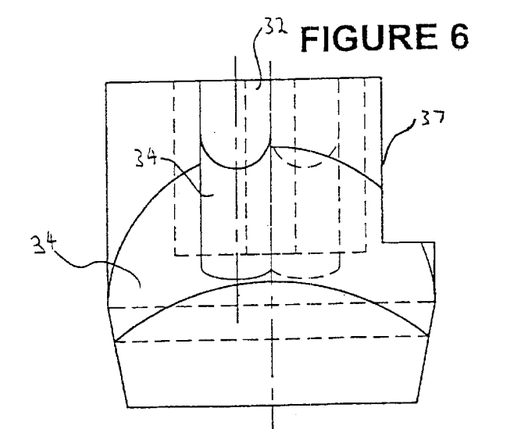
FIG. 6 is a front view of the stuffer cap shown in FIG. 5.
Figure 7:
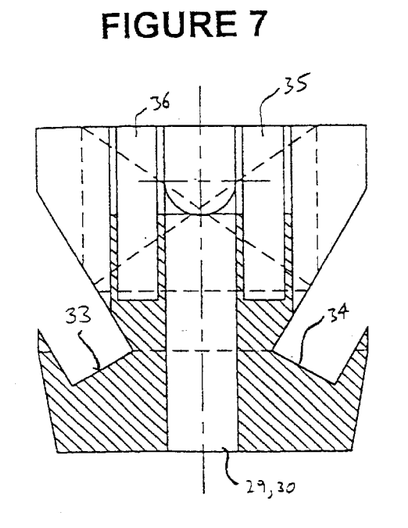
FIG. 7 is a side cross sectional view of the stuffer cap taken along 7—7 of FIG. 5.
Figure 8:
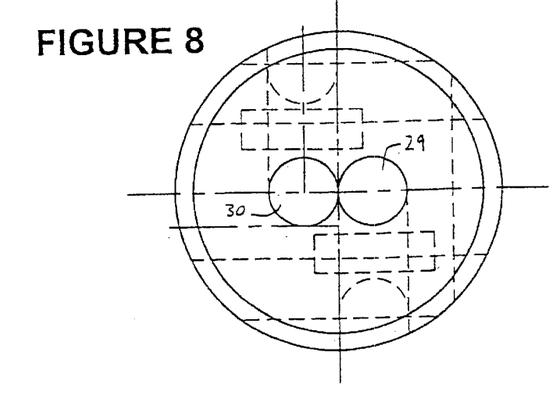
FIG. 8 is a bottom view of the stuffer cap shown in FIG. 5.
Figure 9:
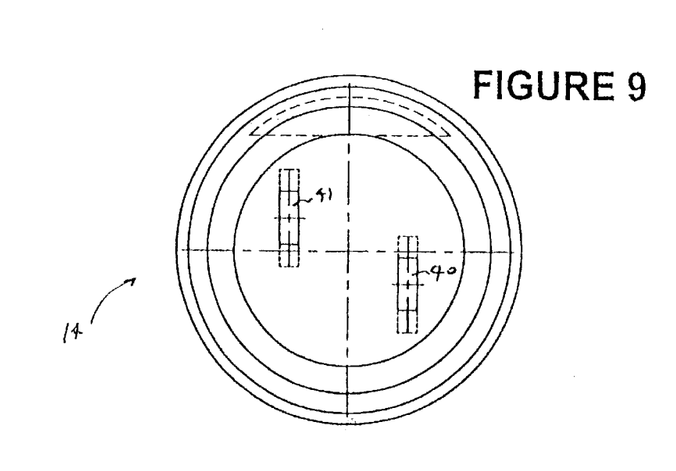
FIG. 9 is a plan view of a mounting cap as used in one embodiment of the invention.
Figure 10:
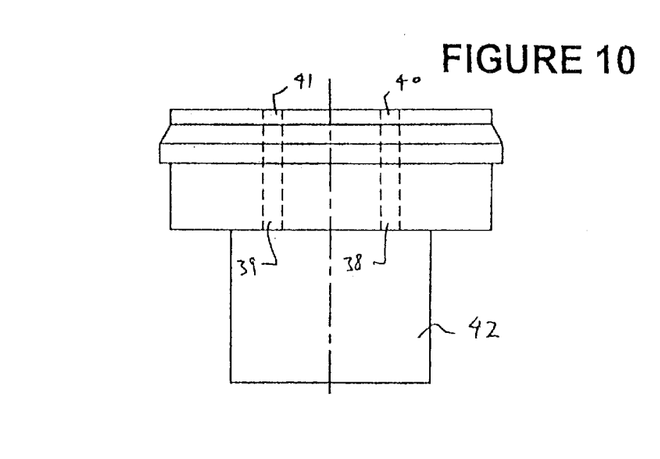
FIG. 10 is a front view of the mounting cap shown in FIG. 9.
Figure 11:
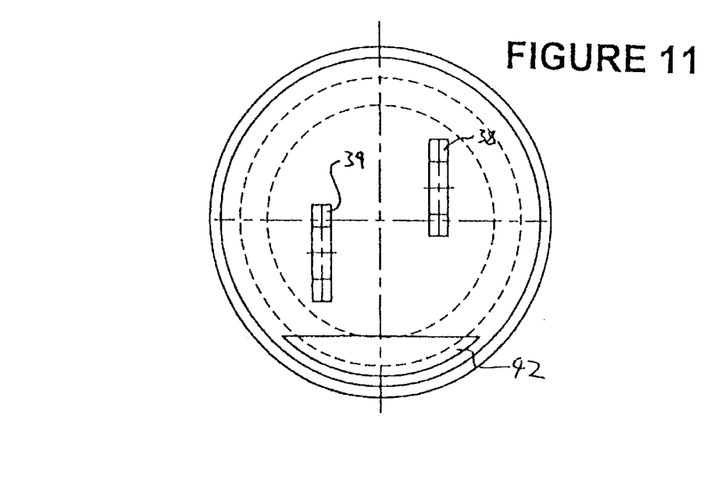
FIG. 11 is a bottom view of the mounting cap shown in FIG. 9.
Figure 12:
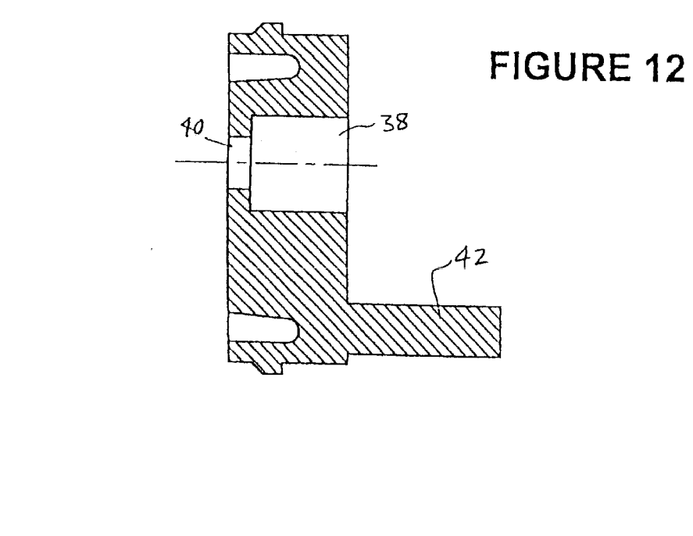
FIG. 12 is a side cross-sectional view of the mounting cap shown in FIG. 9.
Figure 13:
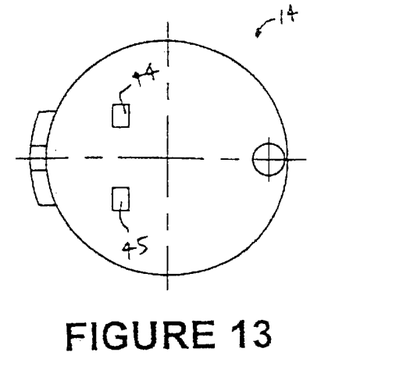
FIG. 13 is a plan view of an alternative embodiment of a mounting cap.
Figure 14:
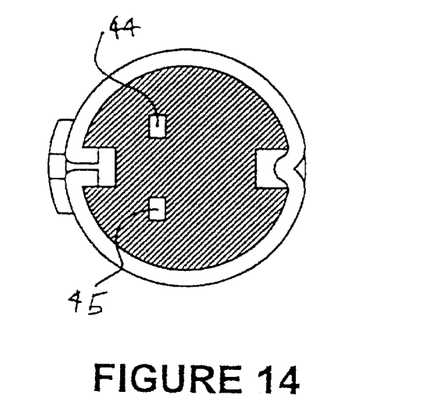
FIG. 14 is a cross-sectional view taken through line 14—14 of FIG. 15.
Figure 15:
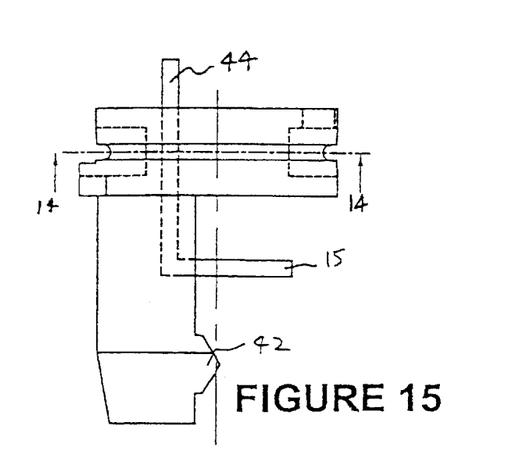
FIG. 15 is a side view of the mounting cap shown in FIG. 13.
Figure 16:
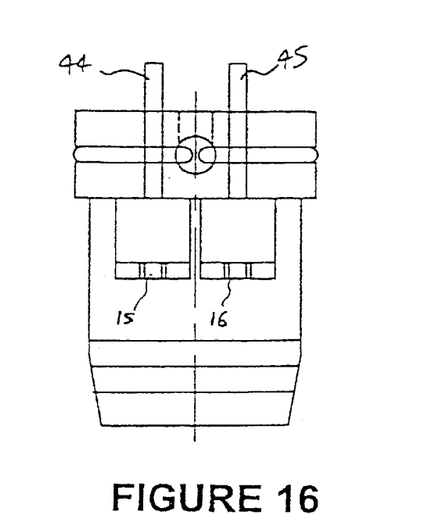
FIG. 16 is a front t view of the mounting cap shown in FIG. 13.
Figure 17:
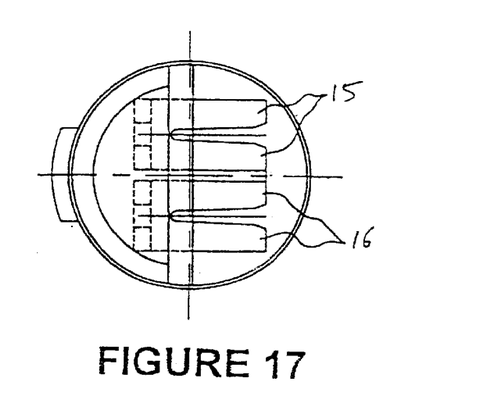
FIG. 17 is a bottom view of the mounting cap shown in FIG. 13.
Figure 18:
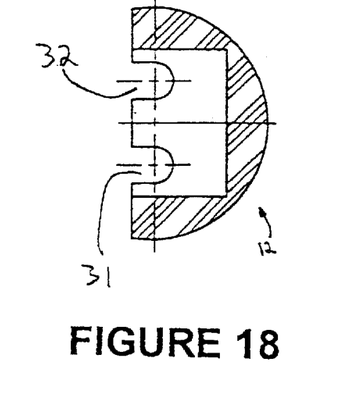
FIG. 18 is a cross-sectional view of an alternative embodiment of a stuffer cap taken through line 18—18 of FIG. 20.
Figure 19:
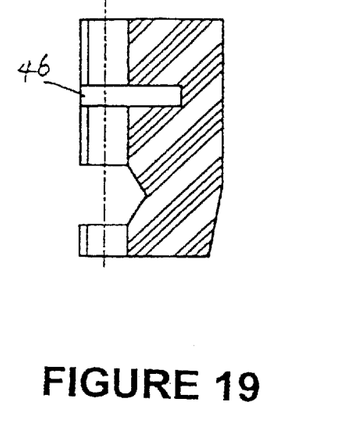
FIG. 19 is a cross-sectional side view taken through line 19—19 of FIG. 20.
Figure 20:
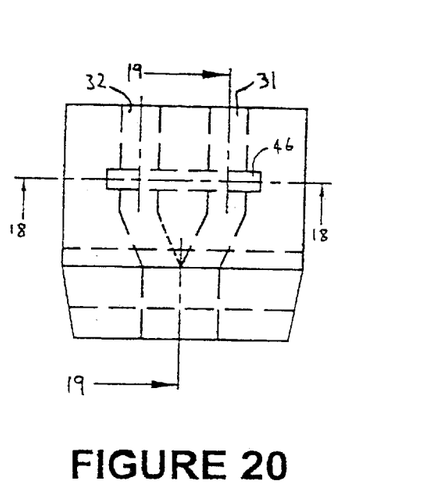
FIG. 20 is a front view of the stuffer cap shown in FIG. 18.
Figure 21:
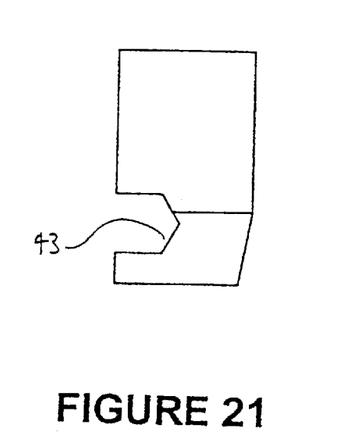
FIG. 21 is a side view of the stuffer cap shown in FIG. 18.
Figure 22:
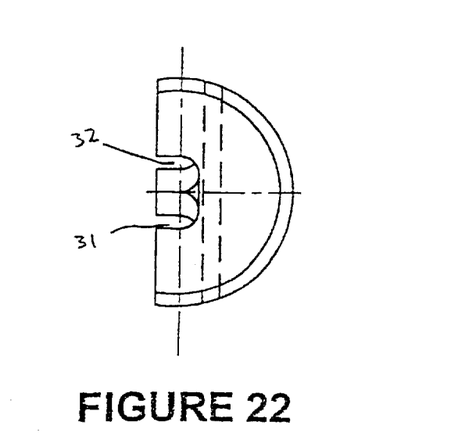
FIG. 22 is a bottom view of the stuffer cap shown in FIG. 18.

The second mounting means 14 is in the form of a mounting cap adapted to mate with the stuffer cap 12 to cause insulation displacement connection between the prongs, 15, 16 and the active wires 5, 6. A first embodiment of the mounting cap 14 is shown in FIGS. 9 to 12 inclusive. The prongs 15 and 16, which are not shown in FIGS. 9 to 12, are mounted in apertures 38 and 39. Pins (not shown) leading to the first transformer are disposed in apertures 40 and 41. The prongs 15 and 16 mate with slots 35 and 36 respectively in the first embodiment:of the stuffer cap, as shown in FIG. 5. The stuffer cap 12 and the mounting cap 14 include keying means such that the mounting cap only mates with the stuffer cap in a predefined relative orientation. This keying means is in the form of a keying projection 42 from the mounting cap 14 which is received in a keying portion 37 of the stuffer cap 12. It will be appreciated by those skilled in the art that the keying means may take many other forms.

The prongs 15 and 16 pierce the insulation of the active wires 4 and 5 in the portion of the wires lying in grooves 31 and 32 above slots 35 and 36 (refer to FIG. 5).

FIGS. 13 to 17 inclusive show an alternative embodiment of a mounting cap 14 wherein the prongs 15 and 16 are orientated transverse to the longitudinal axis of the balun. The first transformer 17 is mounted to pins 44 and 45 which project above the top of the cap. This alternative embodiment of the mounting cap 14 is designed to work in conjunction with the alternative embodiment of the stuffer cap shown in FIGS. 18 to 22 inclusive. In these figures, active wires 4 and 5 are draped in Y shaped grooves 31 and 32 and IDC connection is made when the prongs 15 and 16 are driven into slot 46. Keying means are provided by keying projection 42 on the mounting cap 14 which mates with keying portion 43 on the stuffer cap 12.

Figure 23:
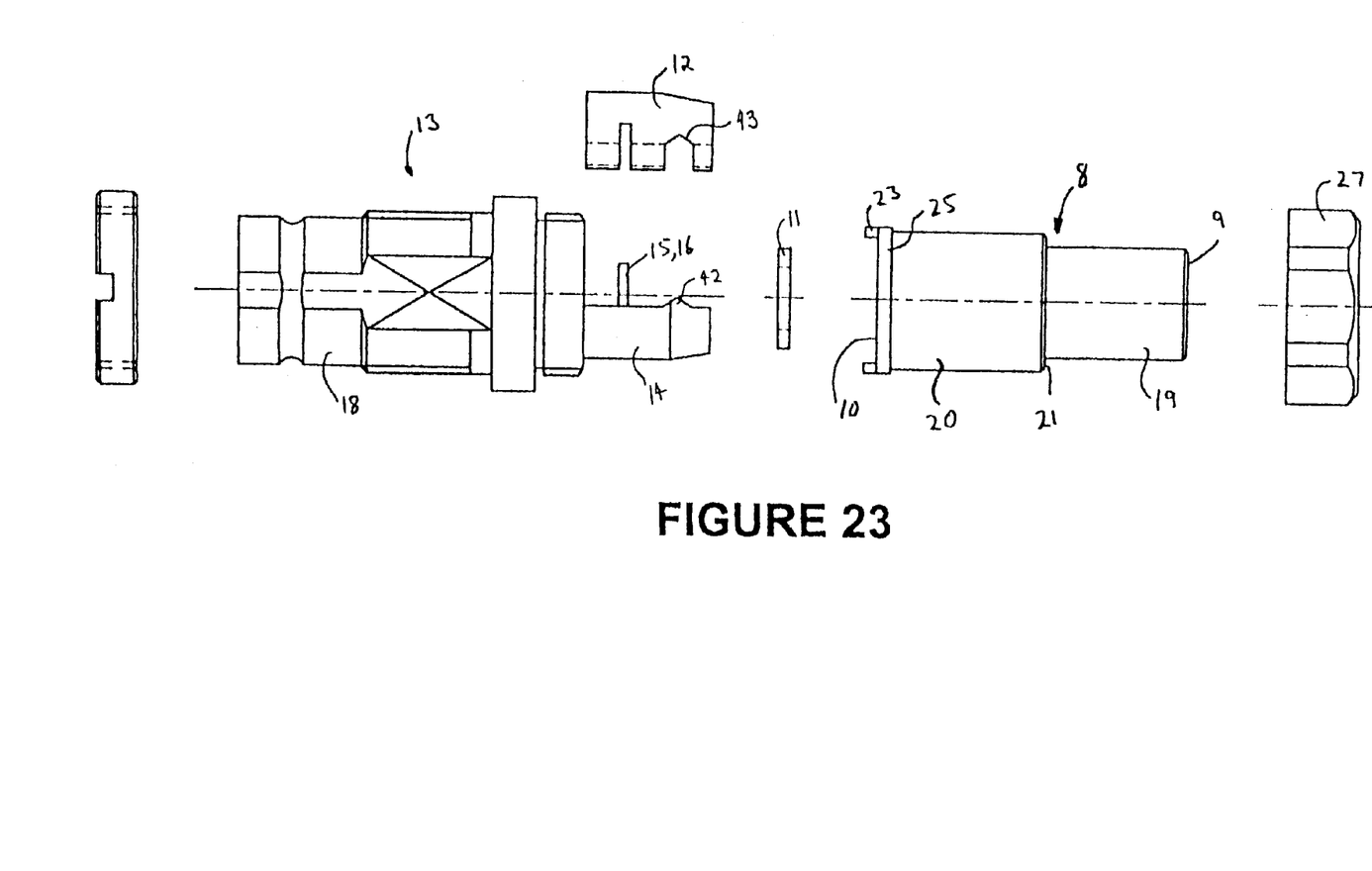
FIG. 23 is a partially disassembled view of a balun according to the present invention utilising the second embodiment of the stuffer cap and mounting cap.

The manner in which the first embodiments of the mounting cap 14 and the stuffer cap 12 are utilised in the balun is shown in FIG. 2. The manner in which the second embodiments of the mounting cap and stuffer cap are utilised in the balun is shown in FIG. 23.

FIGS. 28 to 33 inclusive illustrate alternative embodiments of the balun each incorporating a modified second mounting means 14 having a projection 70. The projection 70 extends through either the first transformer 17 (as in FIG. 28) or the second transformer 60 (as in FIG. 29) so as to abut the insulator 71. This projection 70 helps to ensure that compressive forces generated when a coaxial cable (not illustrated) is plugged into the coaxial connector 18 are not transferred to either the first transformer 17 or the second transformer 60. This advantageously avoids or minimises degradation of the transformers due to mechanical deformation of the coils of the transformers arising from said compressive forces.

Figure 29:
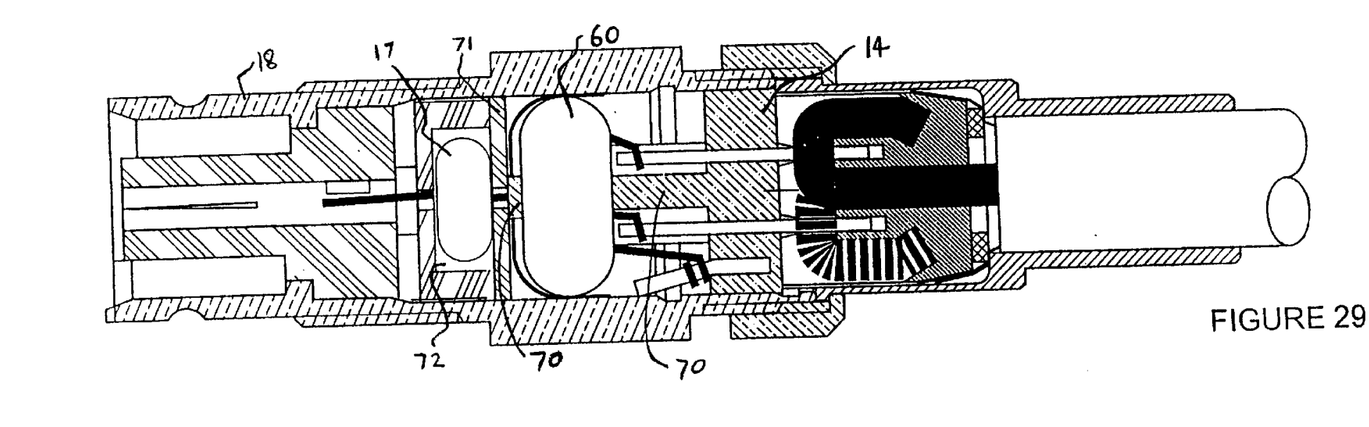
FIG. 29 is a cross-sectional side view of an embodiment of the balun similar to that shown in FIG. 28, but with the addition of a transformer arrangement embodying one of the transformer arrangements shown in FIGS. 26 or 27.
Figure 31:
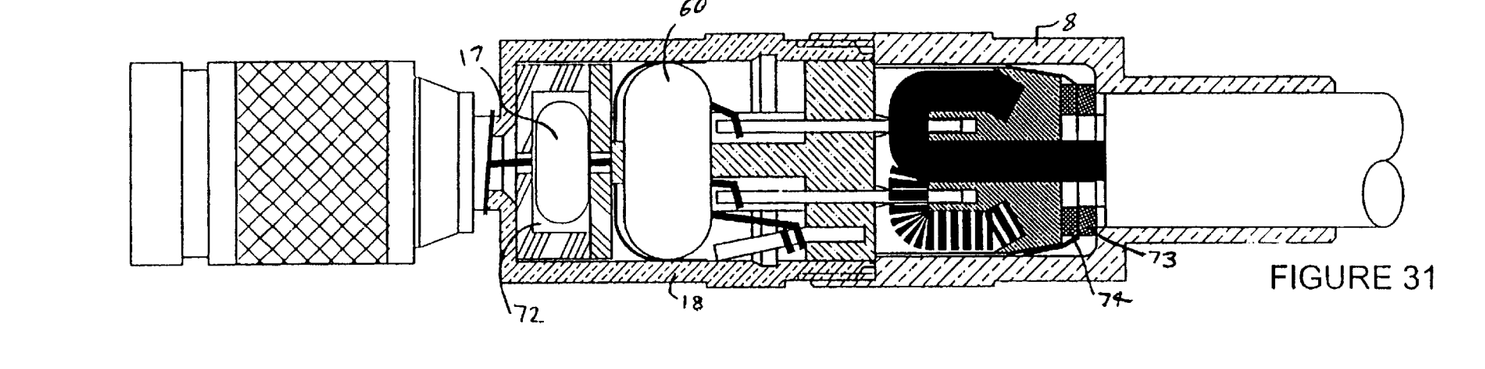
FIG. 31 is a cross-sectional side view of an embodiment of the balun similar to that shown in FIG. 30, but with the addition of a transformer arrangement embodying one of the transformer arrangements shown in FIGS. 26 or 27.
Figure 33:
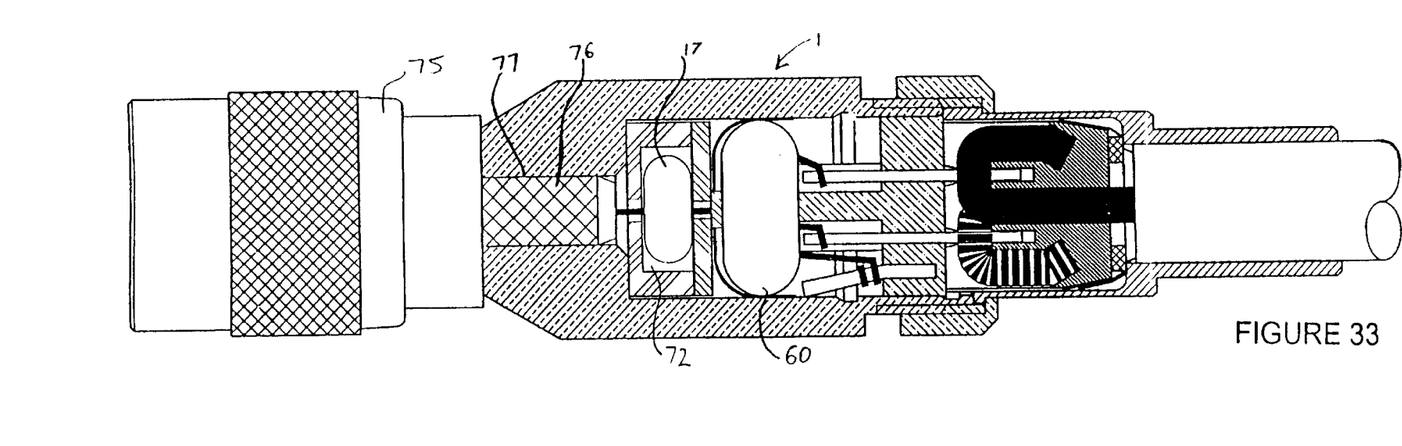
FIG. 33 is a cross-sectional side view of an embodiment of the balun similar to that shown in FIG. 32, but with the addition of a transformer arrangement embodying one of the transformer arrangements shown in FIGS. 26 or 27.

The preferred embodiments illustrated in FIGS. 29, 31 and 33 each include a chamber 72 adapted to house the first transformer 17 so as to enable a second transformer 60 to be disposed within the region normally inhabited by the first transformer 17. This enables the circuitry shown in either FIG. 26 or 27 to be realised (although the test arrangement of resistors is not illustrated in FIGS. 29, 31 or 33). The second transformer 60 is preferably mounted on the same longitudinal axis as the first transformer 17.

Figure 30:
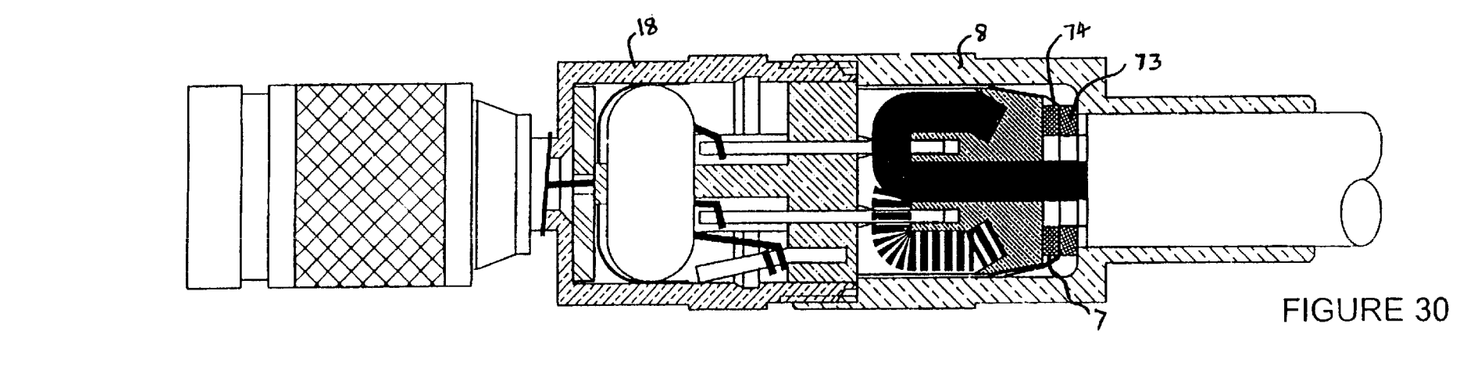
FIG. 30 is a cross-sectional side view of an alternative embodiment of the balun having a further reduced cross-sectional diameter.

FIGS. 30 and 31 illustrate preferred embodiments of the balun having a cross-sectional diameter which is further reduced as compared to the already comparatively narrow embodiments shown in FIGS. 1, 2, 4 and 23. This is achieved by dispensing with nut 27. Rather, the body 8 threadedly engages the coaxial connector 18. This enables the overall cross-sectional diameter of the balun to be reduced from 10.8 mm (in the preferred embodiment illustrated in FIGS. 1, 2, 4 and 23) to 9.5 mm (in the embodiment illustrated in FIGS. 30 and 31). In these slimmer embodiments, two grounding rings 73 and 74 are preferably disposed intermediate the first mounting means 12 and the body 8. This helps to ensure that rotational forces generated when screwing the body 8 onto the coaxial connector 18 are not damagingly transferred to the cable shielding 7.

Figure 32:
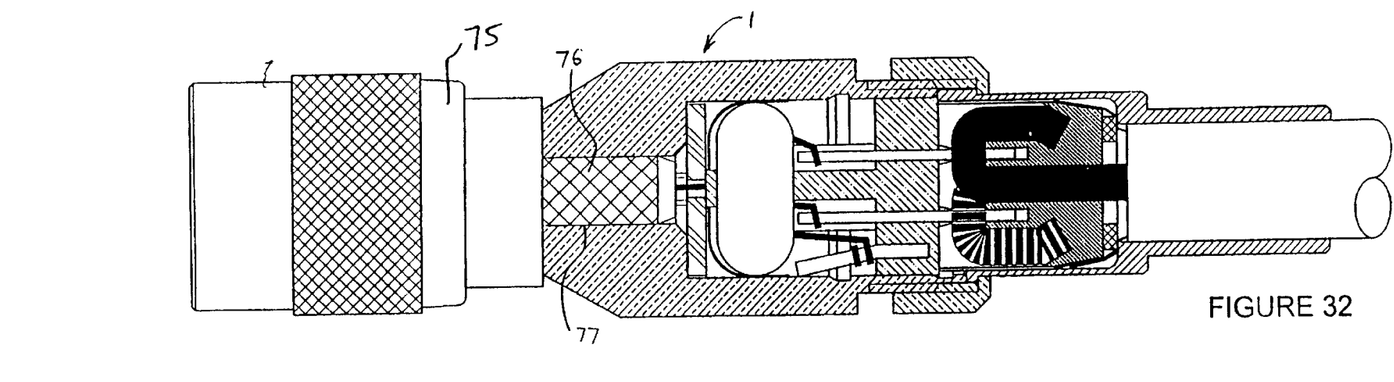
FIG. 32 is a cross-sectional side view of an alternative embodiment of the balun having provision for the connection of a range of coaxial cable connectors.

The embodiments illustrated in FIGS. 32 and 33 are adapted to allow various off-the-shelf coaxial cable connectors 75 to be fitted to the balun 1 during manufacture. The braid portion 76 of the coaxial connector 75 is press-fitted into suitably dimensioned aperture 77 provided at the coaxial end of the balun 1. This advantageously allows a wide variety of coaxial cable connectors 75 to be utilised with the balun 1 of the present invention.

The preferred method for connecting a twisted pair cable 2 having two active wires 4 and 5, an earthing wire 6, shielding 7 and outer insulation 28 to a coaxial cable 3 includes the following steps:

(i) threading said twisted pair cable 2 through a hollow conductive cover 8;

(ii) removing a length of outer insulation 28 from the twisted pair cable 2;

(iii) connecting said shielding 7 and/or the earthing wire 6 to an earthing means 11;

(iv) mounting said active wires 4 and 5 in a first mounting means 12;

(v) housing said first mounting means 11 in the cover 8 such that the earthing means 11 and associated shielding 7 and/or earthing wire 6 make earthing contact with the cover 8 and such that the active wires 4 and 5 are disposed adjacent an aperture 10 of the cover 8;

(vi) mating the body 13 with the cover 8 such that first connectors, in the form of prongs 15 and 16 projecting from the body 13, make electrical connection with active wires 4 and 5, said body 13 including a first transformer 17 electrically connected to the prongs 15 and 16, said body 13 further including a coaxial connector 18 electrically connected to the first transformer 17; and (vii) connecting said coaxial cable 3 to said coaxial connector 18.

The cover 8 has a first cylindrical portion 19 having a minor diameter joined by a radial portion 21 to a second cylindrical portion 20 of major diameter. The earthing means 11 is a ring around which said shielding 7 is wrapped and/or to which said earthing wire 6 is connected. The step of making earthing contact between the ring 11 and the cover 8 entails housing the ring within the cover such that the ring abuts the radial portion 21 within the second portion 20. Preferably the shielding 7 is earthed against the full circumference of the radial portion 21.

The above described method for connecting cables can advantageously be put into effect without the use of any specialised tools. Rather, readily available generalised tools such as a stanley knife and pliers are all that is usually required.

Although the invention has been described with reference to specific examples, it will be appreciated by those skilled in the art that the invention may be embodied in may other forms.

What is claimed is:

1. A balun adapted to electrically connect a twisted pair cable to a coaxial cable, said twisted pair cable having two active wires, an earthing wire and shielding, said balun including:
   a hollow conductive cover defining first and second apertures; said first aperture being sized to accept said twisted pair cable; said cover, when in use, housing an earthing means for electrically connecting said earthing wire and/or shielding to said cover; said cover, when in use, further housing first mounting means adapted to mount said active wires in close proximity to said second aperture; and
   a body housing second mounting means adapted to mount a pair of first connectors projecting from said body; said body further housing a first transformer electrically connected to said first connectors; an end of said body defining a coaxial connector being electrically connected to said first transformer,
   whereby said cover is mountable to said body such that an earthing connection is made therebetween, and such that said first connectors respectively electrically connect with said active wires, thereby completing an impedance matching electrical circuit between said twisted pair cable and said coaxial cable connector.

2. A balun according to claim 1 wherein the earthing means is a metallic ring around which said shielding is wrappable and to which said earthing wire is connectable.

3. A balun according to claim 2 wherein the cover includes a first cylindrical portion of minor diameter defining said first aperture and a second cylindrical portion of major diameter defining said second aperture, said first and second portions being joined by a radial portion, said ring being adapted to abut said radial portion within said second cylindrical portion.

4. A balun according to claim 1 wherein a winding of said first transformer coupled to said twisted pair cable is provided with a centre tap which is electrically connected to ground.

5. A balun according to claim 4 wherein said winding has an external capacitance connected between one or each leg thereof and earth so as to balance uneven capacitance inherent in the winding to ground.

6. A balun according to claim 1 wherein a winding of said first transformer coupled to said twisted pair cable has an external capacitance connected between one or each leg thereof and earth so as to balance uneven capacitance inherent in the winding to ground.

7. A balun according to claim 1 wherein said cover and body include keying means adapted to facilitate mounting.

8. A balun according to claim 7 wherein said keying means includes one or more longitudinally projecting lugs being adapted to mate with corresponding indents.

9. A balun according to claim 1 wherein the cover is rigidly fixable to said body.

10. A balun according to claim 9 wherein said cover includes a radially outwardly projecting lug disposed adjacent said second aperture, said lug adapted to engage a corresponding radially inwardly projecting lug provided on a nut being threadably engageable with the body so as to rigidly fix said cover to said body.

11. A balun according to claim 1 wherein said first mounting means is a stuffer cap.

12. A balun according to claim 11 wherein said stuffer cap includes two longitudinally extending apertures being adapted to receive said active wires, said apertures leading to a transverse face adapted to reside adjacent said second aperture, said face including two offset, generally radial grooves adapted to receive said active wires.

13. A balun according to claim 12 wherein said first connectors are prongs.

14. A balun according to claim 13 wherein said second mounting means is a mounting cap adapted to mate with said stuffer cap to cause insulation displacement connection between the prongs and the active wires.

15. A balun according to claim 14 wherein said stuffer cap and said mounting cap include keying means such that the mounting cap only mates with the stuffer cap in a predefined relative orientation.

16. A balun according to claim 1 wherein the first transformer is a surface mount component.

17. A balun according to claim 1 further including a second transformer connected so as to promote inductive balance between the coaxial cable and the twisted pair cable.

18. A balun according to claim 17 wherein said second transformer is connected in series intermediate a secondary winding of the first transformer and the twisted pair cable.

19. A balun according to claim 17 wherein said second transformer is connected in parallel with the first transformer.

20. A balun according to claim 1 further including a projection disposed upon said second mounting means so as to project through either of said first or second transformer, thereby isolating said transformer from compressive forces generated when a coaxial cable is plugged into said coaxial connector.

21. A balun according to claim 1 wherein said body threadedly engages the coaxial connector.

22. A balun according to claim 21 further including a second grounding ring disposed intermediate said first mounting means and the body so as to isolate said shielding from rotational forces generated during screwing of said body onto the coaxial connector.

23. A balun according to claim 1 wherein a variety of said coaxial cable connectors are engagable with an aperture provided at the coaxial end of the balun.

24. A balun according to claim 23 wherein each of said coaxial connectors include a braid portion which is press-fittingly engageable with said aperture.

25. A balun according to claim 1 wherein said coaxial connector is a socket.

26. A method for connecting a twisted pair cable having two active wires, an earthing wire, shielding and outer insulation to a coaxial cable, said method including the steps of:

i) threading said twisted pair cable through a hollow conductive cover;

ii) removing a length of outer insulation from the twisted pair cable;

iii) connecting said shielding and/or said earthing wire to an earthing means;

iv) mounting said active wires in a first mounting means;

v) housing said first mounting means in said cover such that said earthing means and associated shielding and/or earthing wire make earthing contact with said cover and such that said active wires are disposed adjacent an aperture of said cover;

vi) mating a body with said cover such that first connectors projecting from said body make electrical connection with said active wires, said body including a first transformer electrically connected to said first connectors, said body further including a coaxial connector electrically connected to said first transformer; and vii) connecting said coaxial cable to said coaxial connector.

27. A method according to claim 26 wherein said cover has a first cylindrical portion having a minor diameter jouned by a radial portion to a second cylindrical portion of major diameter and wherein said earthing means is a ring around which said shielding is wrapped and to which said earthing wire is connected, whereby said ring radially abuts said radial portion within said second portion so as to make earthing contact.

* * * * *